US012598719B2

(12) United States Patent
Chetkiewicz et al.

(10) Patent No.: US 12,598,719 B2
(45) Date of Patent: Apr. 7, 2026

(54) FLEXIBLE PRINTED CIRCUIT FOR A GEARBOX CONTROL UNIT OF A COMMERCIAL VEHICLE AND CORRESPONDING GEARBOX CONTROL UNIT

(71) Applicant: ZF CV Systems Europe BV, Brussels (BE)

(72) Inventors: Maciej Chetkiewicz, Katna (PL); Marcin Kubiatowicz, Wroclaw (PL)

(73) Assignee: ZF CV Systems Europe BV, Brussels (BE)

( * ) Notice: Subject to any disclaimer, the term of this patent is extended or adjusted under 35 U.S.C. 154(b) by 314 days.

(21) Appl. No.: 18/273,126

(22) PCT Filed: Jan. 21, 2021

(86) PCT No.: PCT/EP2021/051345
§ 371 (c)(1),
(2) Date: Jul. 19, 2023

(87) PCT Pub. No.: WO2022/156897
PCT Pub. Date: Jul. 28, 2022

(65) Prior Publication Data
US 2024/0306336 A1      Sep. 12, 2024

(51) Int. Cl.
*H05K 1/14*          (2006.01)
*B60W 10/10*          (2012.01)
(Continued)

(52) U.S. Cl.
CPC ........... *H05K 7/1427* (2013.01); *B60W 10/10* (2013.01); *H05K 1/028* (2013.01); *H05K 1/147* (2013.01)

(58) Field of Classification Search
CPC ...... H05K 7/1427; H05K 1/028; H05K 1/147; B60W 10/10
(Continued)

(56) References Cited

U.S. PATENT DOCUMENTS 5,010,246 A * 4/1991 Tsuyuguchi ............. G11B 7/12
10,158,384 B1 * 12/2018 Yarga ................... H04B 1/0458
2015/0098198 A1 4/2015 Drew et al.

FOREIGN PATENT DOCUMENTS

DE          68912389 T2      8/1994
EP           1831055 A1      9/2007

OTHER PUBLICATIONS

European Patent Office, Rijswijk, Netherlands, International Search Report of International Application No. PCT/EP2021/051345, Mailed Oct. 19, 2021, 3 pages.

* cited by examiner

*Primary Examiner* — Binh B Tran
(74) *Attorney, Agent, or Firm* — Dickinson Wright PLLC

(57)          ABSTRACT

A flexible printed circuit (112) for a gearbox control unit (102) of a commercial vehicle includes a body section (126) and an arm section (148). The arm section (148) is attached to the body section (126). The body section (126) includes a body mounting interface (150) for mounting the flexible printed circuit (112) to a bottom housing section (104) and/or a top cover (6) of a gearbox control unit (102). The arm section (148) includes an arm mounting interface (130) having at least one opening (132). The opening (132) is configured to receive a fastening device (134) arranged at a bottom housing section (104) and/or a top cover (6) of the gearbox control unit (102).

17 Claims, 8 Drawing Sheets

(51) Int. Cl.
    *H05K 1/02*            (2006.01)
    *H05K 7/14*            (2006.01)
(58) Field of Classification Search
    USPC ......................................................... 361/752
    See application file for complete search history.

2

12  12  16

16  4

2

6

4

112

102       108

112          130          134 \ 152

132

102

112          130

154                                                    134

FLEXIBLE PRINTED CIRCUIT FOR A GEARBOX CONTROL UNIT OF A COMMERCIAL VEHICLE AND CORRESPONDING GEARBOX CONTROL UNIT

FIELD

The present disclosure is directed to a flexible printed circuit for a gearbox control unit of a commercial vehicle. More particularly, the present disclosure is directed to a flexible printed circuit having a body section and an arm section, said arm section being attached to said body section, wherein said body section includes a body mounting interface for mounting the flexible printed circuit to a bottom housing section and/or a top cover of a gearbox control unit.

BACKGROUND

Flexible printed circuits are known from the prior art. In the commercial vehicle industry, for example, such flexible printed circuits are utilized to connect different units of a gearbox control unit that is used for automated manual transmission (AMT) devices. Gearbox control units typically comprise a bottom housing section and a top cover comprising an electronic control unit (ECU). The ECU needs to be connected to the other components of the gearbox control unit arranged in the bottom housing section. For this purpose, flexible printed circuits are utilized. Such flexible printed circuits typically comprise a body section being attached to said housing and an arm section which is on one end releasably connected to an interface connector at the top cover.

A major challenge that arises with the use of flexible printed circuits is that such circuits can easily be damaged, for example during the assembly process of the top cover to the bottom housing section. During assembly, flexible printed circuits may easily be pinched between housing sections. A related challenge arises during operation of the gearbox control unit, during which vibrations are transferred to the printed circuit. In case a flexible printed circuit is arranged in the proximity of sharp housing edges, the flexible printed circuit may get into contact with such edges which, in turn, may cause damages.

SUMMARY

Therefore, it is an object of the present disclosure to provide a flexible printed circuit and a gearbox control unit that overcome the above-mentioned issues as far as possible. In particular, it was an object of the present disclosure to provide a flexible printed circuit that achieves a long service life and remains free from damage and abrasion even if housing parts of the gearbox control unit are frequently assembled and dissembled or subject to vibrations during operation. In this way, position and orientation of the arm section are precisely defined by the fastening device.

According to the present disclosure, it is proposed that that the arm section comprises an arm mounting interface having at least one opening, the opening being configured to receive a fastening device arranged at a bottom housing section and/or a top cover of the gearbox control unit.

The present disclosure takes advantage of the finding that with the help of such an arm mounting interface having an opening in which the fastening device can be received, the relative position of the arm section can be precisely determined to avoid any non-predictable movement of the arm section, which might, in turn, damage the circuit. This is especially the case when sharp housing edged are arranged in the proximity of the arm section. Furthermore, fastening devices that are already present at a gearbox control unit to, for example, provide a snap fitting functionality for housing parts, may be used to determine the position of the arm section in a precise manner. In other words, no additional parts at the gearbox control unit are required.

Preferably, the arm section comprises a longitudinal body section, wherein the arm mounting interface extends laterally from such body section. In this way, the mechanism for guiding an electrical signal through the flexible printed circuit may be arranged in the body section. The arm mounting interface may extend from the body section such that the arm mounting interface forms a so-called "ear" that is attached to the body section. In this way, the arm mounting interface is easily accessible and the use of already present fastening devices is facilitated.

According to a preferred embodiment, the arm mounting interface comprises a thickness which is substantially equal to the thickness of the body section. The thickness direction is defined such as to extend perpendicular to the respective surfaces of the arm mounting interface.

This is especially beneficial in case multiple flexible printed circuit layers are stacked upon one another. In this case, the equal thickness of the arm mounting interface and the body section facilitates a uniform stackability.

According to yet another preferred embodiment, the arm mounting interface is a first arm mounting interface, and the arm section further comprises at least a second arm mounting interface, each extending laterally from the body section, and wherein the first and second arm mounting interfaces extend from the body section in opposite lateral directions from one another. In this way, two arm mounting interfaces may be used to enable an exact positioning of the flexible printed circuit. Moreover, a rotation of the flexible printed circuit is even better inhibited—compared to a solution comprising only one arm mounting interface. Also, two different fastening devices being present, for example, at the gearbox control unit, may be utilized by such flexible printed circuit.

Preferably, the arm section comprises a first end portion, a second end portion, and a hinge portion connecting both sections, and wherein the hinge portion is configured to enable the second section to abut against the first section, when the second section is hinged towards the first section. Such a hinge arranged at the arm section facilitates a foldable arrangement of the flexible printed circuit. The arrangement ensures that such a foldable flexible printed circuit is long enough to conveniently separate the housing components of the gearbox control unit, while the position of the flexible printed circuit is precisely determined when the gearbox control unit is in an assembled state. It is moreover preferred that the arm section comprises an offset section being laterally or vertically offset from the body section.

It is moreover preferred that the first section and the second section each comprise an arm mounting interface, and wherein, when the sections are hinged towards one another, the openings are aligned to one another.

In a further aspect, the present disclosure relates to a gearbox control unit for a commercial vehicle, said gearbox control unit comprising a bottom housing section configured to be attached to a gearbox of a vehicle, a top cover, the top cover being releasably attached to the bottom housing section, an interface connector arranged at the top cover, a flexible printed circuit, the flexible printed circuit being arranged at the bottom housing section and releasably connected to the interface connector.

The present disclosure solves the aforementioned problem related to the gearbox control unit in that the flexible printed circuit is a flexible printed circuit according to the embodiments described above. The gearbox control unit takes advantage of the same benefits and preferred embodiments as the flexible printed circuit according to the present disclosure. In this regard, reference made is to the above explanations and the content is included herein.

According to a preferred embodiment, the fastening device arranged at the bottom housing section and/or the top cover is a bracket snap. Such a bracket snap is utilized in two different ways: first, as a way to provide a snap functionality for releasably attaching housing components to one another and, second, as a fastening device to precisely determine the position of the flexible printed circuit to avoid any unwanted movements and damages of the same.

According to yet another preferred embodiment, the bracket snap comprises or is made of plastic or metal. Plastic is easy to form and less expensive, wherein a bracket snap made from metal might be more durable.

According to a third aspect of the present disclosure or according to another preferred embodiment of the present disclosure according to the first and second aspect, the flexible printed circuit is mounted between the top cover and the bottom housing section, said flexible printed circuit being at least one of preformed or biased, such as to deform by bending towards one definitive side.

Preferably, the flexible printed circuit forms a c-shape. In other words, the flexible printed circuit establishes a c-shape when the top cover is moved towards the bottom housing section. Such a c-shape has been found to be beneficial to ensure that the flexible printed circuit is securely stored between the top cover and the bottom housing section when the top cover is attached to the bottom housing section. Further, when top cover and bottom housing section are moved away from one another, the flexible printed circuit allows for a convenient accessibility of the sections when the flexible printed circuit is still connected to the components. Therewith, damages to the flexible printed circuit during maintenance operations are avoided. For example, it is avoided that the flexible printed circuit would clamp in between different components of the housing.

Preferably, the flexible printed circuit extends along a longitudinal extent of the bottom housing section. According to an alternative embodiment, the flexible printed circuit is mounted to the bottom housing section at a distance from a longitudinal housing edge towards which the flexible printed circuit is bent, which distance is greater than half of the total length of the flexible printed circuit.

According to yet another preferred embodiment, the flexible printed circuit comprises a first surface and a second surface, the second surface being opposite from the first surface, and wherein the flexible printed circuit is bent about the first surface or the second surface. In this way, it is ensured that the flexible printed circuit takes the C-shape automatically when the top cover is guided towards the bottom housing section before the components are even assembled to one another.

In an even further aspect, the present disclosure relates to a method for assembling a gearbox control unit of a commercial vehicle. According to the present disclosure, said method comprises the steps of providing a bottom housing section configured to be attached to a gearbox of a vehicle, said bottom housing section having a flexible printed circuit, providing a top cover, the top cover being releasably attached to the bottom housing section, said top cover having an interface connector, connecting the flexible printed circuit to the interface connector, moving the top cover toward the bottom housing section such that the printed circuit is bent into a c-shape.

The method for assembling the gearbox control unit takes advantage of the same benefits and preferred embodiments as the flexible printed circuit and the gearbox control unit according to the present disclosure. In this regard, reference is made to the above explanations and their content is included herein.

BRIEF DESCRIPTION OF THE DRAWINGS

The aspects of the disclosure may best be understood from the following detailed description taken in conjunction with the accompanying figures. The figures are schematic and simplified for clarity, and they show details to improve the understanding of the claims while other details are left out. Throughout, the same reference numerals are used for identical or corresponding parts. The individual features of each aspect may each be combined with any or all features of other aspects.

These and other aspects, features and/or technical effects will be apparent from and elucidated with reference to the illustrations described hereafter, in which.

DETAILED DESCRIPTION

Figure 1:
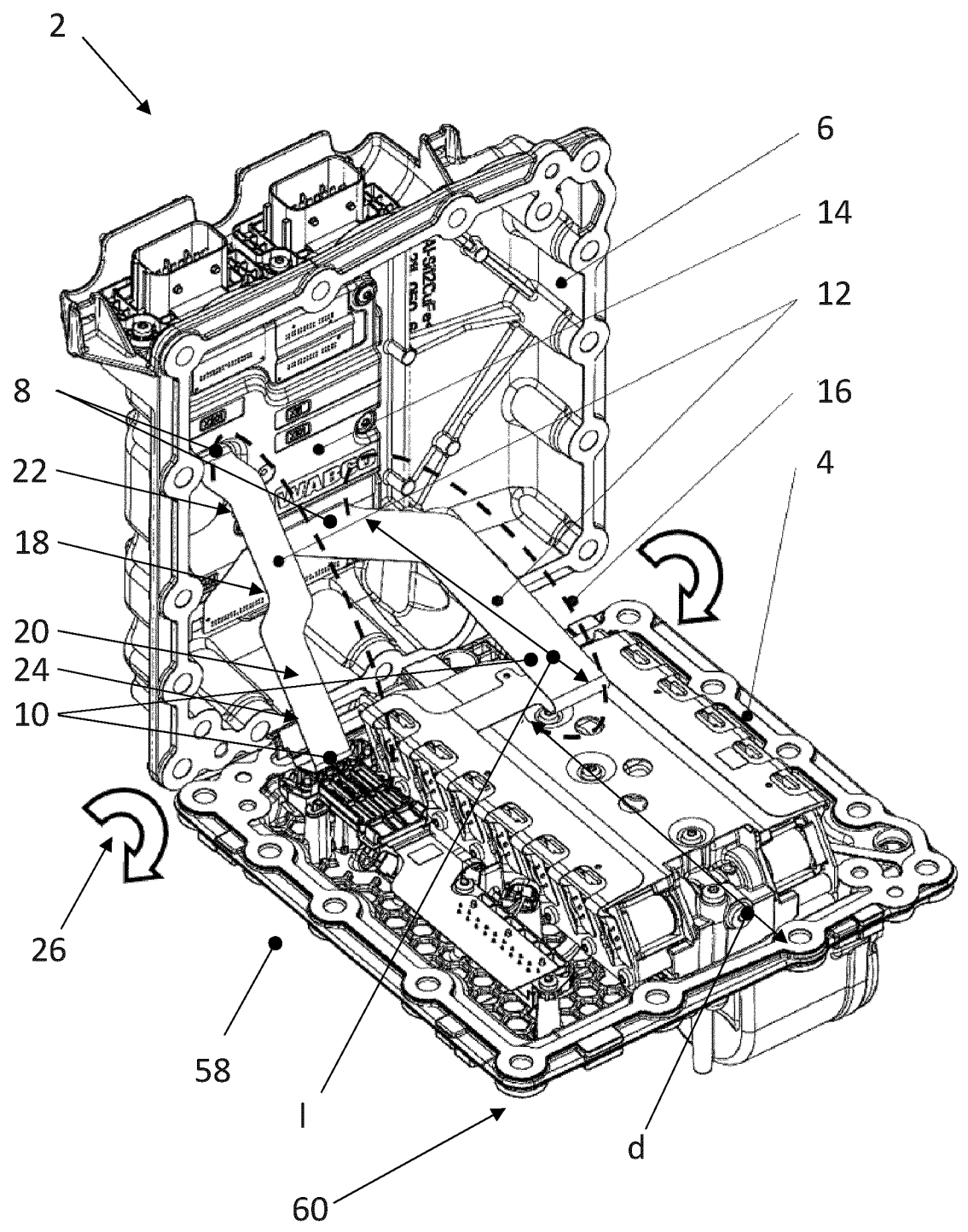
FIG. 1 shows a preferred embodiment of a gearbox control unit according to the concept of the present disclosure.

FIG. 1 shows a gearbox control unit 2 for a commercial vehicle. The gearbox control unit 2 comprises a bottom housing section 4 configured to be attached to a gearbox of a vehicle. The gearbox control unit 2 furthermore comprises a top cover 6. The top cover 6 is releasably attachable to the bottom housing section 4. In the top cover 6, a control unit 14 is arranged. In FIG. 1, the top cover 6 is connected to the bottom housing section 4 by way of a flexible printed circuit 12. The flexible printed circuit 12 is releasably connected to an interface connector 8 and unsolvably to an attachment section 10. The interface connector 8 is arranged at the top cover 6. The attachment section 10 is arranged at the bottom housing section 4. The top cover 6 is attached to the bottom housing section 4 forming a pivot axis 26 between the top cover 6 and the bottom housing section 4. When the top cover 6 is moved towards the bottom housing section 4, the flexible printed circuit 12 bends. In other words, the flexible printed circuit 12 forms a c-shape 16.

This is illustrated with the dashed lines 16 of FIG. 1. The flexible printed circuit 12 comprises a first surface 18 and a second surface 20. The second surface 20 is opposite from the first surface 18. The flexible printed circuit 12 is bent about the first surface 18. Alternatively, the flexible printed circuit 12 may be bent about the second surface 20 (not shown in the figures). The first surface 18 comprises a first section 22 extending from the interface connector 8. The first surface 18 also comprises a second section 24 extending from the attachment section 10. The flexible printed circuit 12 is mounted at the bottom housing section 4 at a distance d from a longitudinal housing edge 60 towards which the flexible printed circuit 12 is bent, which is greater than half of the total length l of the flexible printed circuit 12.

Figure 2:
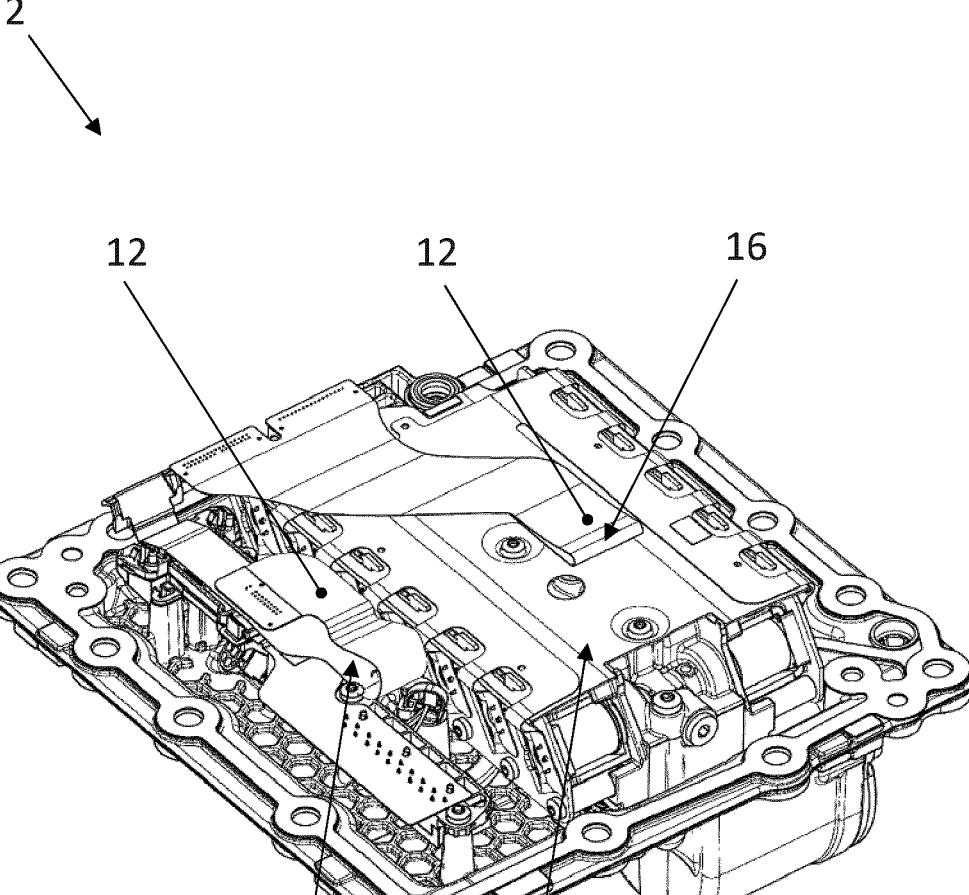
FIG. 2 shows the gearbox control unit according to the preferred embodiment of FIG. 1 with the top cover not shown.
Figure 3:
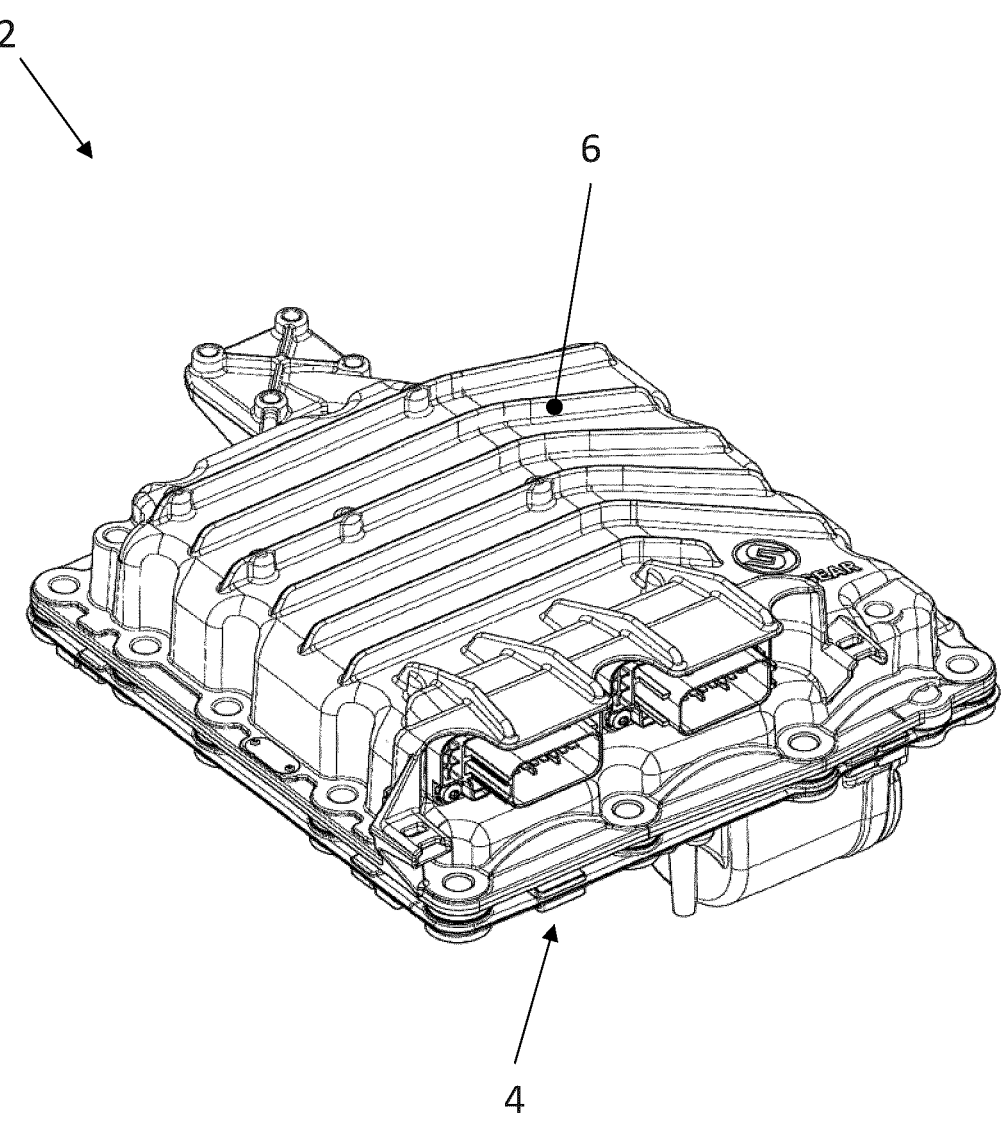
FIG. 3 shows the gearbox control unit according to the preferred embodiment with the top cover attached.

The first section 22 and the second section 24 face one another when the top cover 6 is attached to the bottom housing section 4. This is illustrated in FIG. 2. FIG. 3 shows the gearbox control unit 2, wherein the top cover 6 is attached to the bottom housing section 4.

Figure 4:
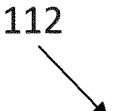
FIGS. 4-8 shows an alternative embodiment of a circuit board unit of a gearbox control unit and a gearbox control unit.
Figure 4:
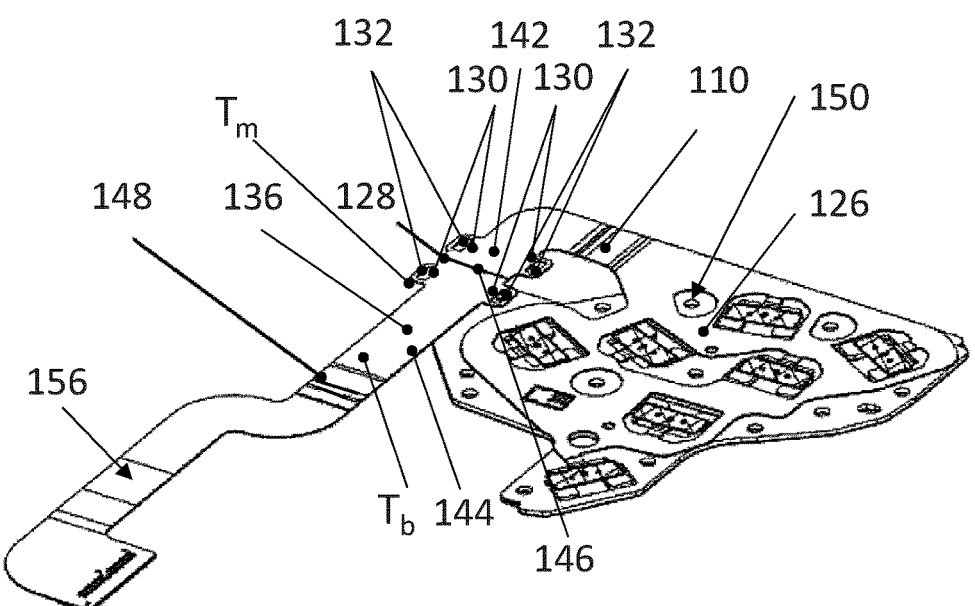

FIG. 4 shows a flexible printed circuit 112. The flexible printed circuit 112 is releasably connectable to an interface connector 108 (see FIG. 7) and comprises a body section 126 and an arm section 148. The body section comprises a body mounting interface 150. The arm section 148 comprises four arm mounting interfaces 130 each having one opening 132 therein. The arm mounting interfaces 130 are arranged in a mounting area 128. The openings 132 are configured to receive a fastening device 134 (see FIG. 7).

The arm section 148 comprises a longitudinal body section 136. The arm mounting interfaces 130 extend laterally from such body section 136. The arm mounting interfaces 130 comprise a thickness $T_m$ which is substantially equal to the thickness $T_b$ of the body section 136. The arm section 148 comprises a first section 142. The first section 142 comprises two arm mounting interfaces 130 each extending laterally from the body section 136, and wherein the arm mounting interfaces 130 extend from the body section 136 in opposite lateral directions from one another. The arm section 148 further comprises a second section 144. The second section 144 comprises two arm mounting interfaces 130 each extending laterally from the body section 136, and wherein the arm mounting interfaces 130 extend from the body section 136 in opposite lateral directions from one another.

The arm section 148 furthermore comprises a hinge 146 arranged between the first section 142 and the second section 144. The hinge 146 is configured to enable the second section 144 to contact the first section 142, when the second section 144 is hinged towards the first section 142. The arm section 148 furthermore comprises an offset section 156.

Figure 5:
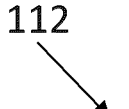
Figure 5:
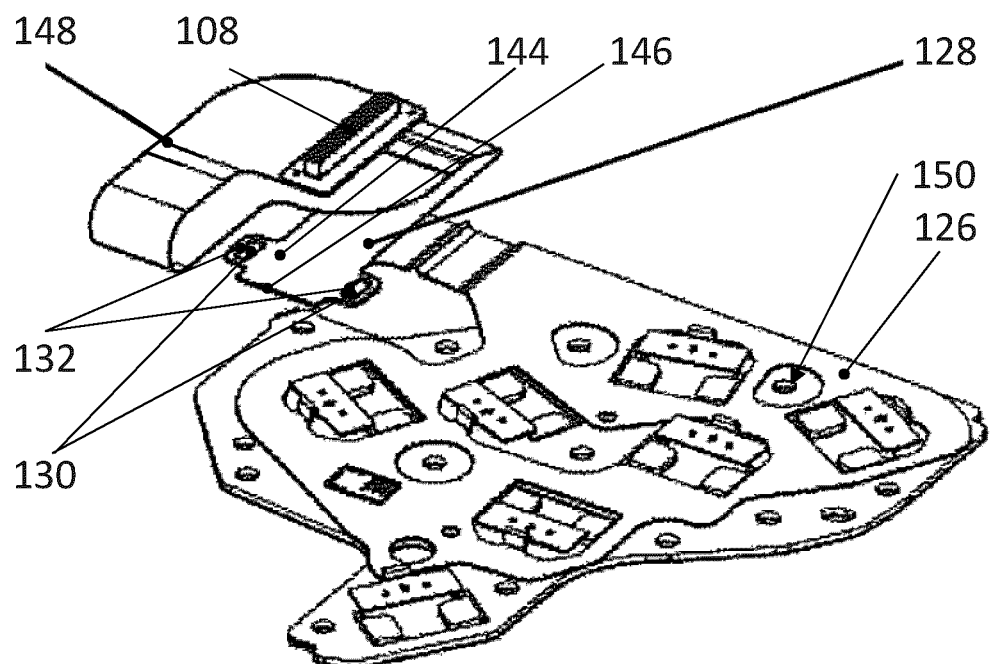
Figure 6:
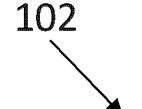
Figure 6:
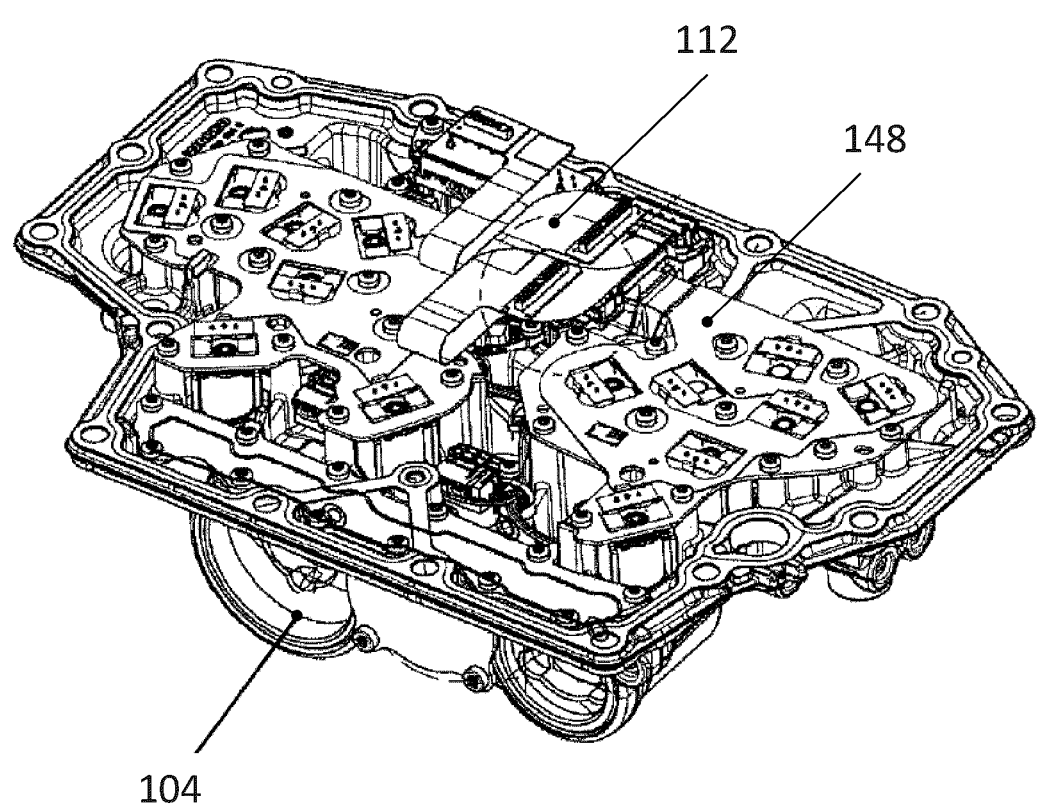

In FIG. 5, the sections 142, 144 are hinged towards one another. In this state, the openings 132 of the arm mounting interfaces 130 correspond to one another. FIG. 6 shows the flexible printed circuit 112 attached to a gearbox control unit 102. Furthermore, the bottom housing section 104 is shown.

Figure 7:
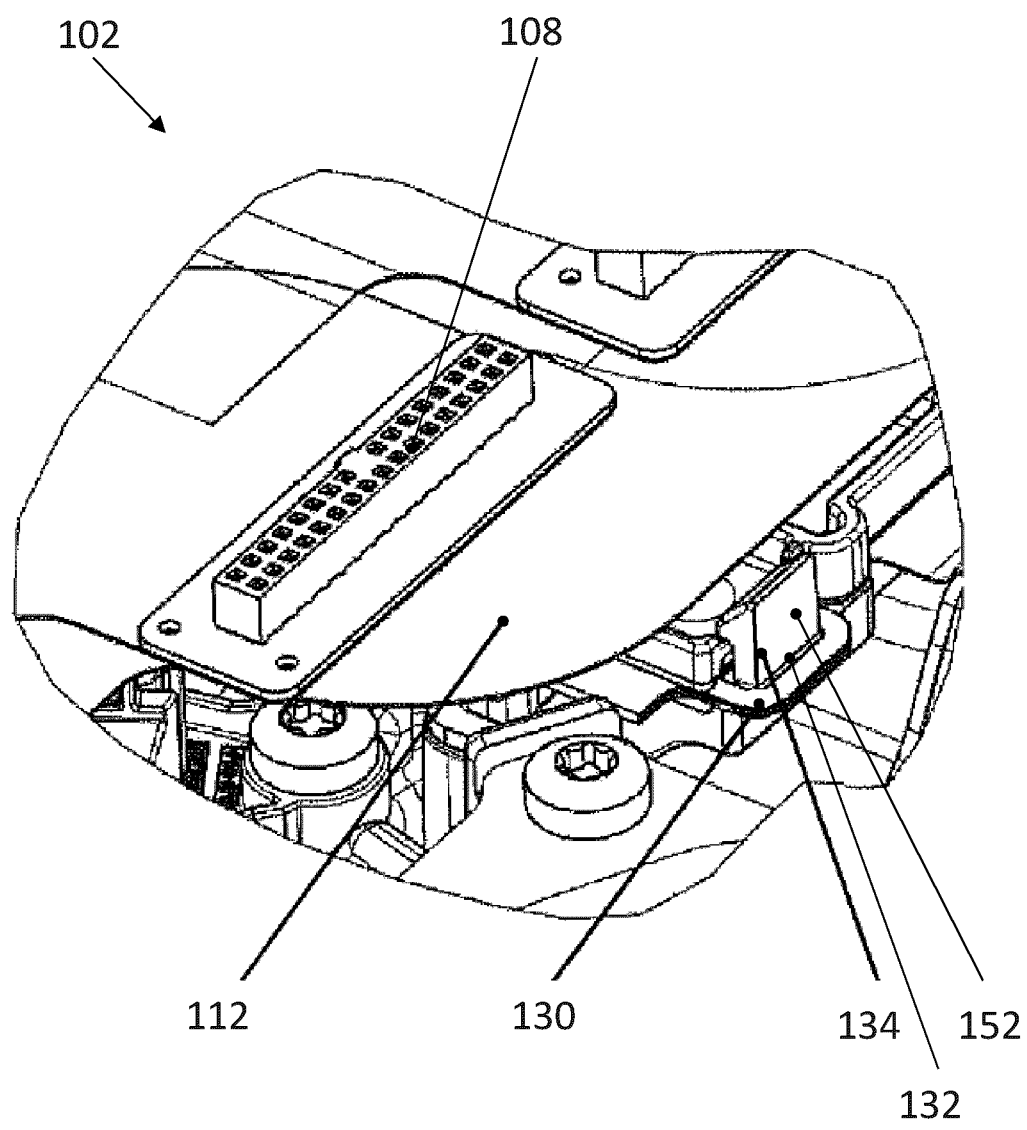
Figure 8:
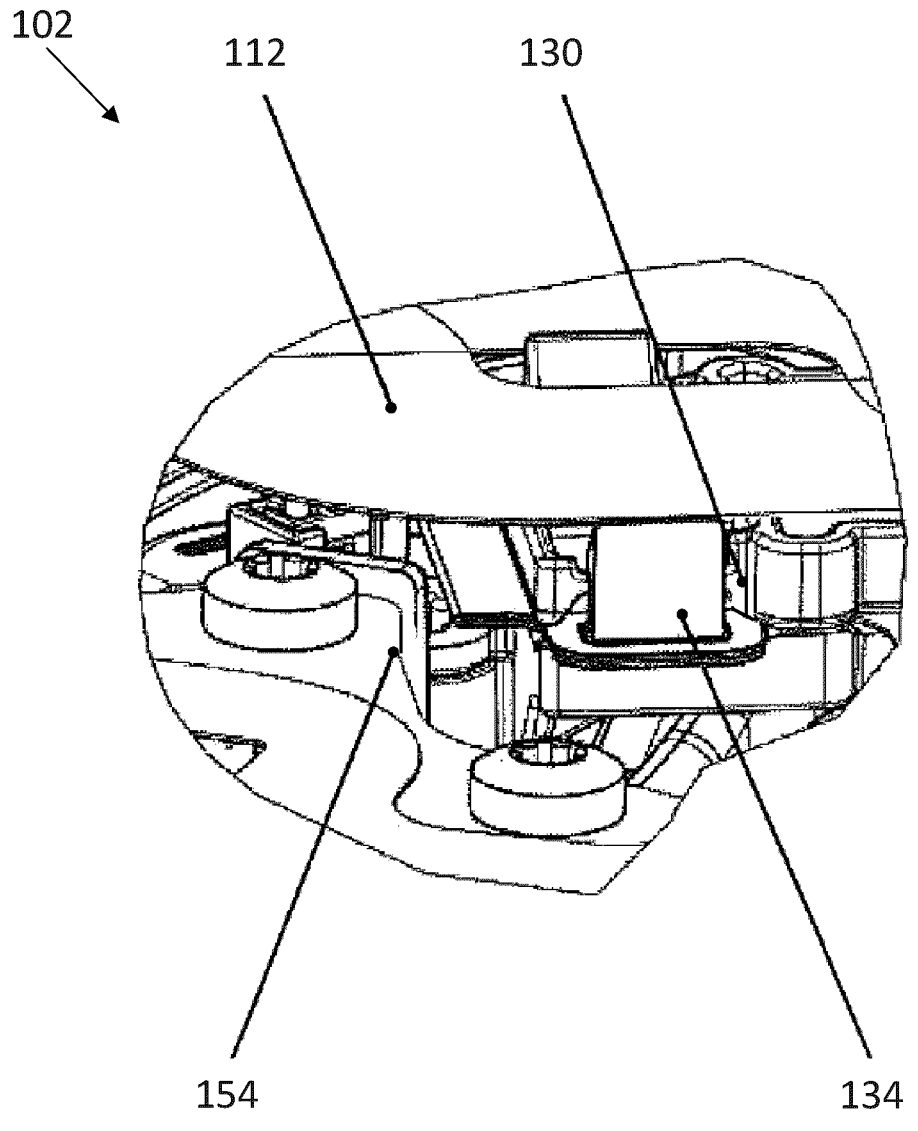

FIGS. 7 and 8 show detailed perspectives making reference to FIG. 6. It can be obtained from these figures that the opening 132 is configured to receive a fastening device 134 arranged at the bottom housing section 104. The fastening devices 134 keep the flexible printed circuit 112 in place. The fastening devices 134 are bracket snaps 152. These bracket snaps 152 may additionally be used to clamp components or housing parts to the bottom housing section 104. The bracket snap 152 is made from plastic and may alternatively be made of metal. FIG. 7 also shows the interface connector 108 which may be connected to the flexible printed circuit 112. In FIG. 8, a sharp edge 154 is shown. It needs to be avoided that the flexible printed circuit 112 touches such a sharp edge 154 since this may damage or destroy the flexible printed circuit 112.

LIST OF REFERENCES 2 gearbox control unit
4 bottom housing section 6 top cover
8 interface connector
10 attachment section
12 flexible printed circuit
14 control unit
16 c-shaped bias/preform
18 first surface
20 second surface
22 first section
24 second section
26 pivot axis
58 longitudinal extent
60 longitudinal edge
102 gearbox control unit
104 bottom housing section
108 interface connector
110 attachment section
112 flexible printed circuit
126 body section
128 mounting area
130 arm mounting interface
132 opening
134 fastening device
136 body section
142 first section
144 second section
146 hinge
148 arm section
150 body mounting interface
152 bracket snap
154 sharp edge
156 offset section
d distance from a longitudinal edge
l total length of the flexible printed circuit
$T_m$ mounting interface thickness
$T_b$ body section thickness

The invention claimed is:

1. A flexible printed circuit (112) for a gearbox control unit (102) of a commercial vehicle, said flexible printed circuit (112) comprising:

a body section (126) and an arm section (148), said arm section (148) being attached to said body section (126), wherein said body section (126) includes a body mounting interface (150) for mounting the flexible printed circuit (112) to a bottom housing section (104) and/or a top cover (6) of a gearbox control unit (102), wherein the arm section (148) includes at least one arm mounting interface (130) having at least one opening (132), the opening (132) being configured to receive a fastening device (134) arranged at a bottom housing section (104) and/or a top cover (6) of the gearbox control unit (102);

wherein the arm section (148) comprises a longitudinal body section (136), and wherein the arm mounting interface (130) extends laterally from the body section (136);

wherein the arm mounting interface (130) is a first arm mounting interface, and the arm section (148) further includes at least a second arm mounting interface (130), the first and second arm mounting interfaces extending laterally from the longitudinal body section (136) of the arm section (148), and wherein the first and second arm mounting interfaces (130) extend from the longitudinal body section (136) in opposite lateral directions from one another.

2. The flexible printed circuit (112) according to claim 1, wherein the arm mounting interface (130) has a thickness ($T_m$) that is substantially equal to a thickness ($T_b$) of the body section (136).

3. A flexible printed circuit (112) for a gearbox control unit (102) of a commercial vehicle, said flexible printed circuit (112) comprising:

a body section (126) and an arm section (148), said arm section (148) being attached to said body section (126), wherein said body section (126) includes a body mounting interface (150) for mounting the flexible printed circuit (112) to a bottom housing section (104) and/or a top cover (6) of a gearbox control unit (102), wherein the arm section (148) includes at least one arm mounting interface (130) having at least one opening (132), the opening (132) being configured to receive a fastening device (134) arranged at a bottom housing section (104) and/or a top cover (6) of the gearbox control unit (102);

wherein the arm section (112) comprises a first section (142), a second section (144), and a hinge portion (146) connecting the first and second sections, and wherein the hinge portion (146) enables the second section (144) to abut against the first section (142) when the second section (144) is hinged towards the first section (142).

4. The flexible printed circuit (112) according to claim 3, wherein the first section (142) and the second section (144) each include one or more of the at least one arm mounting interface (130), and wherein, when the first and second sections (142, 144) are hinged towards one another, the openings (132) of the arm mounting interfaces of the first and second sections are aligned to one another.

5. A gearbox control unit (2, 102) for a commercial vehicle, said gearbox control unit (2, 102) comprising:

a bottom housing section (4, 104) configured to be attached to a gearbox of a vehicle, a top cover (6), the top cover (6) being releasably attached to the bottom housing section (4, 104), an interface connector (8, 108) arranged at the top cover (6), a flexible printed circuit (12, 112) being arranged at the bottom housing section (4, 104), the flexible printed circuit being connected to the interface connector (8, 108), wherein the flexible printed circuit (12, 112) comprises:

a body section (126) and an arm section (148), said arm section (148) being attached to said body section (126), wherein said body section (126) includes a body mounting interface (150) mounted to the bottom housing section (4, 104) and/or the top cover (6), wherein the arm section (148) includes at least one arm mounting interface (130) having at least one opening (132), wherein the opening (132) receives a fastening device (134) arranged at the bottom housing section (4, 104) and/or the top cover (6);

wherein the fastening device (134) arranged at the bottom housing section (4, 104) and/or the top cover (6) is a bracket snap (152).

6. The gearbox control unit (2, 102) according to claim 5, wherein the bracket snap (152) comprises or is made of plastic or metal.

7. The gearbox control unit (2, 102) according to claim 5, wherein the flexible printed circuit (12, 112) is mounted between the top cover (6) and the bottom housing section (4, 104), said flexible printed circuit (12, 112) being at least one of preformed or biased, wherein the flexible printed circuit (12, 112) deforms by bending towards one definitive side (16).

8. The gearbox control unit (2, 102) according to claim 7, wherein the flexible printed circuit (12, 112) forms a c-shape (16) when deformed and bent toward the one definitive side.

9. The gearbox control unit (2, 102) according to claim 7, wherein the flexible printed circuit (12, 112) extends along a longitudinal extent of the bottom housing section (4, 104).

10. The gearbox control unit (2, 102) according to claim 7, wherein the flexible printed circuit (12, 112) bends along a longitudinal extent (58) of the bottom housing section (4, 104).

11. The gearbox control unit (2, 102) according to claim 7, wherein the flexible printed circuit (12, 112) is mounted to the bottom housing section (4, 104) at a mounting point located at a distance (d) from a longitudinal housing edge (60), wherein the longitudinal housing edge (60) is at an opposite side of the bottom housing section (4, 104) from a pivot axis (26) that is formed between the bottom housing section and the top cover, wherein the flexible printed circuit (12, 112) is bent toward the mounting point, wherein the distance (d) is greater than half of the total length (l) of the flexible printed circuit (12, 112).

12. The gearbox control unit (2, 102) according to claim 7, wherein the flexible printed circuit (12, 112) comprises a first surface (18) and a second surface (20), the second surface (20) being opposite from the first surface (18), and wherein the flexible printed circuit (12, 112) is bent about the first surface (18) or the second surface (20).

13. The gearbox control unit (2, 102) according to claim 7, wherein the flexible printed circuit (12, 112) bends when the top cover (6) moves toward the bottom housing section (4, 104).

14. The gearbox control unit (2, 102) according to claim 13, wherein the flexible printed circuit (12, 112) remains attached to the top cover (6) and the bottom housing section (4, 104) when the top cover (6) and the bottom housing section (4, 104) move away from each other.

15. The gearbox control unit (2, 102) according to claim 5, wherein a housing component is attached to the bracket snap, and the bracket snap also determines the position of the flexible printed circuit (12, 112).

16. The gearbox control unit (2, 102) according to claim 5, wherein the arm section (112) comprises a first section (142), a second section (144), and a hinge portion (146) connecting the first and second sections, and wherein the hinge portion (146) enables the second section (144) to abut against the first section (142) when the second section (144) is hinged towards the first section (142).

17. The gearbox control unit (2, 102) according to claim 16, wherein the first section (142) and the second section (144) each include one or more of the at least one arm mounting interface (130), and wherein, when the first and second sections (142, 144) are hinged towards one another, the openings (132) of the arm mounting inter-
faces of the first and second sections are aligned to one
another.

\* \* \* \* \*